United States Patent [19]
Jang et al.

[11] Patent Number: 5,622,894
[45] Date of Patent: Apr. 22, 1997

[54] PROCESS TO MINIMIZE A SEAM IN TUNGSTEN FILLED CONTACT HOLES

[75] Inventors: Syun-Ming Jang; Yu C. Douglas, both of Hsin-Chu, Taiwan

[73] Assignee: Taiwan Semiconductor Manufacturing Company Ltd, Hsin-Chu, Taiwan

[21] Appl. No.: 616,852

[22] Filed: Mar. 15, 1996

[51] Int. Cl.$^6$ .................................................. H01L 21/441
[52] U.S. Cl. ............................ 438/643; 438/644; 438/636; 438/629; 438/668
[58] Field of Search ............................. 437/190, 192, 437/194, 196, 197

[56] References Cited

U.S. PATENT DOCUMENTS

| | | | |
|---|---|---|---|
| 5,124,780 | 6/1992 | Sandhu et al. | 437/190 |
| 5,312,775 | 5/1994 | Fujii et al. | 437/194 |
| 5,332,691 | 7/1994 | Kinoshita et al. | 437/192 |
| 5,387,550 | 2/1995 | Cheffings et al. | 437/189 |
| 5,395,795 | 3/1995 | Hong et al. | 437/194 |
| 5,407,861 | 4/1995 | Marangon et al. | 437/192 |
| 5,420,072 | 5/1995 | Fiordalice et al. | 437/192 |
| 5,422,310 | 6/1995 | Ito | 437/192 |

*Primary Examiner*—Chandra Chaudhari
*Attorney, Agent, or Firm*—George O. Saile

[57] ABSTRACT

A process has been developed in which high aspect ratio contact holes, are filled with chemically vapor deposited tungsten plugs, exhibiting little or no seam at the center of the tungsten plug. The process features protection of the tungsten plug from the final removal and overetch steps, needed to remove residual tungsten from areas outside the contact hole. This is accomplished by delaying the residual removal procedure, until the tungsten plug is protected by an overlying interconnect metallization structure.

24 Claims, 5 Drawing Sheets

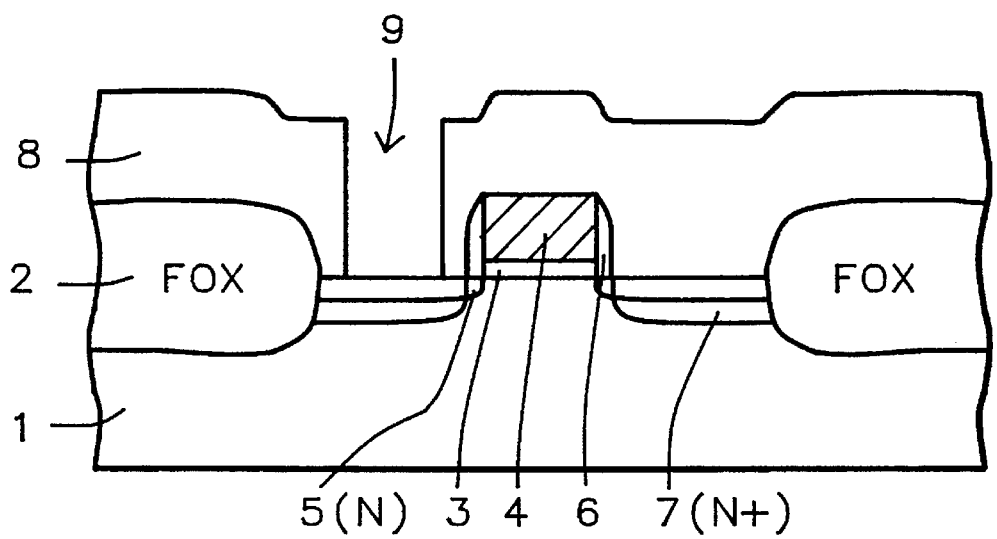
*FIG. 1*
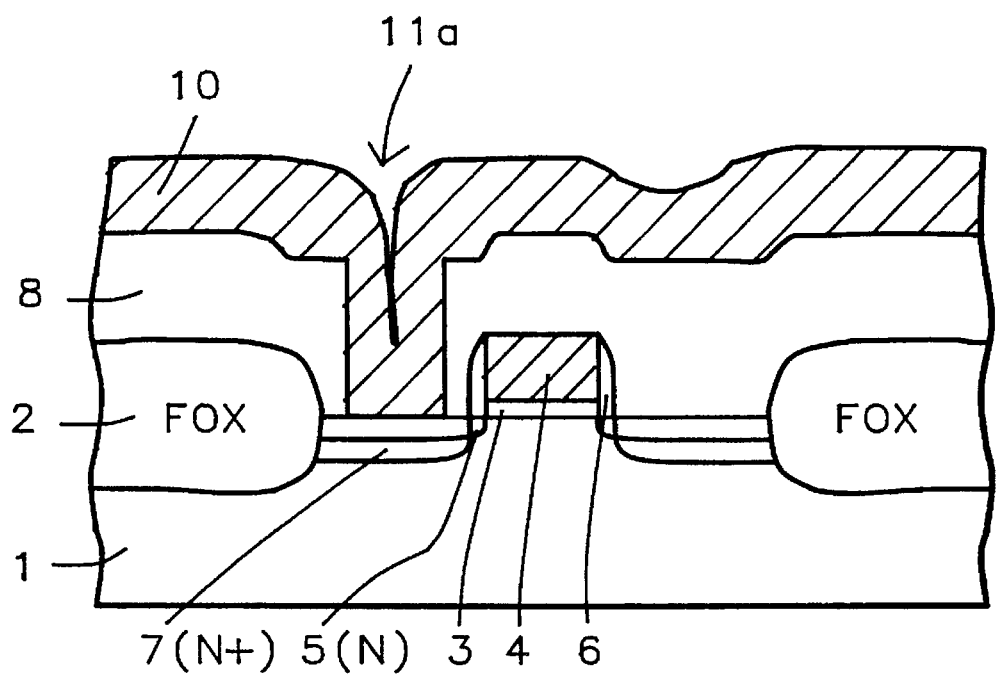
*FIG. 2 — Prior Art*

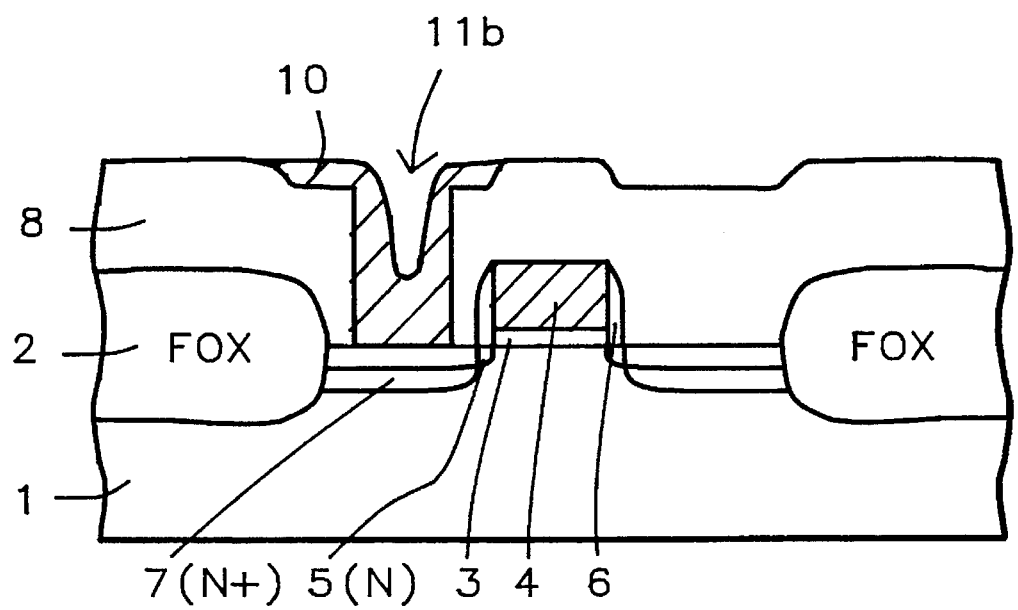
FIG. 3 — Prior Art
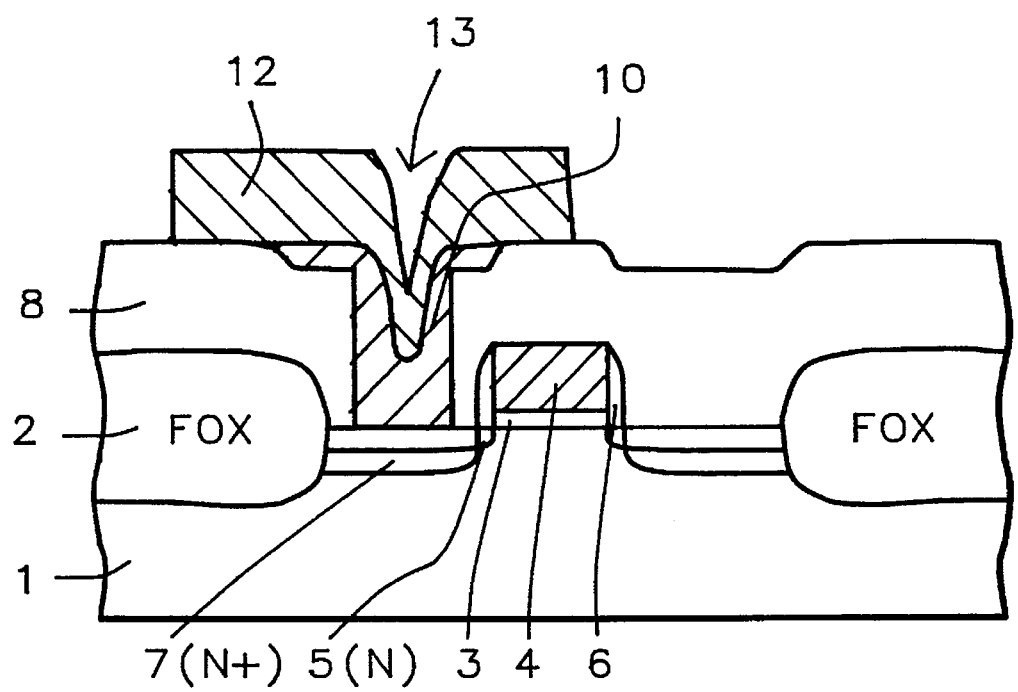
FIG. 4 — Prior Art

PROCESS TO MINIMIZE A SEAM IN TUNGSTEN FILLED CONTACT HOLES

BACKGROUND OF THE INVENTION

1. FIELD OF THE INVENTION

This invention relates to methods used to fabricate semiconductor devices, and more specifically to a process for creating tungsten filled contact, or via holes.

2. DESCRIPTION OF PRIOR ART

The objectives of the semiconductor industry are to continually improve the performance of silicon devices, while maintaining or decreasing the cost of these devices. The ability to manufacture silicon chips, exhibiting sub-micron features, have in part, allowed the performance and cost objectives to be realized. For example silicon devices, fabricated with specific sub-micron features, result in larger decreases in performance degrading resistances and capacitances, then counterparts fabricated using less aggressive designs. In addition the ability to produce smaller silicon chips, due to the use of smaller features, allows more chips to be produced from a specific size starting silicon substrate. Since the processing cost for the silicon substrate remains the same, the cost of an individual silicon chip is reduced. The use of sub-micron features, or the trend to micro-miniaturazation, has been achieved as a result of advances or development of several semiconductor fabrication disciplines, such as photolithography, and dry etching. The use of more sophisticated exposure cameras, as well as the development of more sensitive photoresist materials, have allowed sub-micron images to be routinely produced in photoresist layers. In addition the development of selective, anisotropic, dry etching processes, have allowed these sub-micron images in photoresist layers, to be successfully transferred to underlying materials, used for the fabrication of advanced silicon devices.

However with the trend to micro-miniaturazation, difficulties are encountered with specific semiconductor fabrication sequences, that had not been present for counterparts fabricated using larger device features. For example via or contact holes, used to interconnect two levels of metallization, or used to connect an overlying metallization to an underlying silicon device region, become more difficult to fill with a conductive material, such as aluminum, using metal deposition processes, such as evaporation or sputtering. Chemically vapor deposited processes supply superior fill characteristics, however it is difficult to chemically vapor deposit aluminum. In addition the use of aluminum, to fill via or contact holes, is limited due to the combination of increased current carrying demands, arising as a result of micro-miniaturazation, and the poor current carrying characteristics of aluminum. Therefore the industry has preferred to use tungsten as a fill material for small diameter contact holes, taking advantage of the improved conformality properties of the chemically vapor deposited tungsten, and the enhanced current carrying characteristics of tungsten.

One specific shortcoming of the use of chemically vapor deposited, metal fills, is the seam or dimple in the fill. The metal fill proceeds by the mechanism of the depositing metal film, coating the sides of the contact hole. At a specific point, where the coated sides converge, a seam or dimple can evolve. Subsequent processing, such as dry etching used to remove unwanted metal from areas outside the contact hole, can aggravate the seam and produce a metal void, in the center of the contact or via hole. The void now offers a severe topology for subsequent interconnect metallizations, which can sometimes result in yield or reliability problems. Therefore the semiconductor industry has offered many solutions for the seam or dimple phenomena, encountered when using chemically vapor deposited metal films, specifically tungsten, to fill small diameter contact holes. One such solution, used to alleviate the dimple or seam phenomena for tungsten fills, has been offered by Cheffings, et al, in U.S. Pat. No. 5,387,550. Cheffings suggests a process for filling voids or seams, in tungsten filled contact holes, with chemically vapor deposited silicon. Marangon, et al, in U.S. Pat. No. 5,407,861, use a two stage dry etching process to remove unwanted tungsten, from areas outside the tungsten filled contact hole. The second stage of the dry etching procedure, performed at different conditions then the previous etching stage, remove tungsten residuals without significant attack of the tungsten in the contact hole, thus not aggravating the seam. The above solutions of minimizing the tungsten seam, add cost and complexity to the process.

The solution offered in this invention is the partial etch-back of tungsten, from areas outside the contact hole, still leaving residual tungsten in unwanted areas. An interconnect metallization deposition, followed by photoresist patterning and dry etching, form the desired interconnect metallization structure, as well removing residual tungsten, titanium nitride, and titanium from areas outside the interconnect metallization structure. The photoresist pattern and the interconnect metallization structure, overlying the tungsten filled contact hole, protect against aggravating the seam in the tungsten fill.

SUMMARY OF THE INVENTION

It is an object of this invention to fill deep contact holes, with small diameter openings, with chemically vapor deposited tungsten.

It is another object of this invention to partially remove the unwanted tungsten, from areas outside the contact hole via a blanket, dry etching procedure.

It is still another object of this invention to deposit an interconnect metallization layer, and pattern the interconnect metallization layer, via use of dry etching procedures, to form an interconnect metallization structure, completely overlying the tungsten filled contact hole.

It is still yet another object of this invention to include an overetch sequence to the dry etching procedure, used to create the interconnect metallization structure, to completely remove tungsten from areas outside the interconnect metallization structure.

In accordance with the present invention a method is described for fabricating small diameter, tungsten filled, contact holes, in which the effects of a seam in the tungsten fill is minimized by use of specific etch back sequences. A deep contact hole, with a small diameter, is opened in a dielectric layer, to an active device region in a semiconductor substrate. A layer of titanium, to be used for adhesion and contact purposes, and a layer of titanium nitride, to be used as a barrier to protect underlying materials from attack from subsequent process reactants, are deposited. A layer of chemically vapor deposited tungsten is used, to fill the deep, small diameter contact hole. A minimum of RIE etch back of the unwanted tungsten is performed, to create the tungsten plug in the small diameter contact hole. An interconnect metallization layer is deposited and patterned using photoresist and dry etching procedures. The dry etching sequence used to create an interconnect metallization structure is extended to completely remove tungsten, titanium nitride, and titanium from regions outside the interconnect metallization structure. Overlying photoresist, as well as the interconnect metallization structure, protect the tungsten in the contact hole from being exposed to the overetch process.

BRIEF DESCRIPTION OF THE DRAWINGS

The object and other advantages of this invention are best described in the preferred embodiment with reference to the attached drawings that include:

FIG. 1, which schematically, in cross-sectional style, shows a silicon device, at a stage prior to tungsten contact hole filling.

FIGS. 2–4, which schematically, in cross-sectional style, show prior art, in which seams in a tungsten fill, resulted in inadequate, interconnect metallization coverage.

DESCRIPTION OF THE PREFERRED EMBODIMENTS

Figure 5:
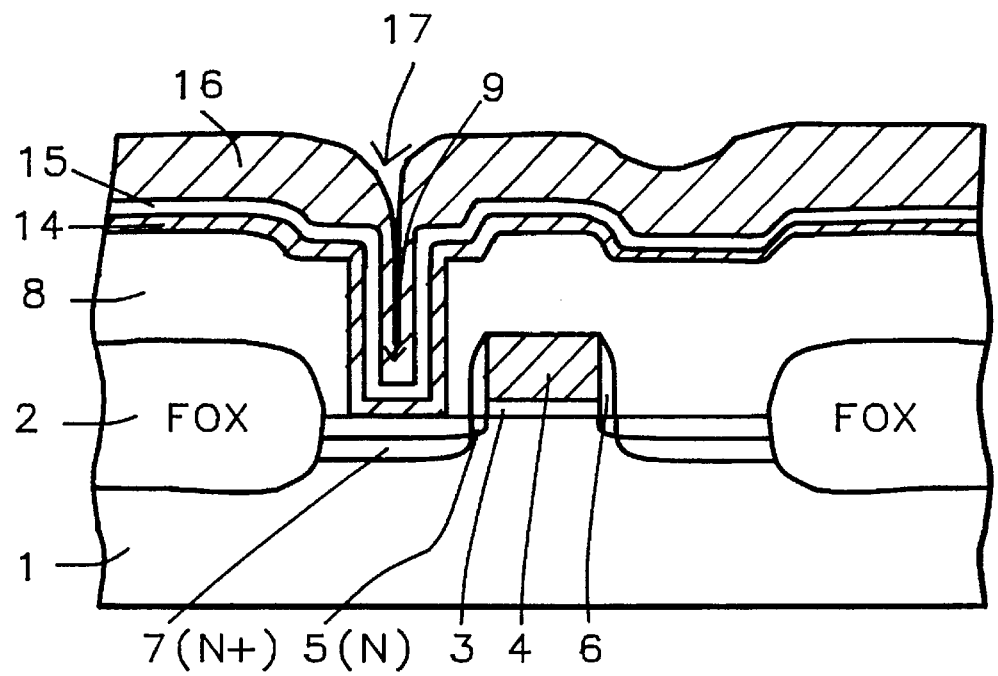
FIGS. 5–9, which schematically, in cross-sectional style, show specific fabrication stages used to produce tungsten fills with a minimum of seams, thus allowing adequate interconnect metallization coverage to be achieved.

The method for creating small diameter, tungsten filled, contact holes, with little or no tungsten seam, will now be described. This invention can be used as part of metal oxide semiconductor field effect transistors, (MOSFET), devices, that are currently being manufactured in industry, therefore only the specific areas, unique to understanding this invention, will be covered in detail.

FIG. 1, schematically shows an N channel, (NFET), device, that this invention of tungsten filling, of small diameter contact holes, can be applied to. A P type, single crystalline silicon substrate, 1, with a <100> crystallographic orientation, is used. Thick field oxide regions, (FOX), 2, are formed for purposes of device isolation. The FOX regions are produced by patterning a composite layer of silicon nitride on silicon dioxide, using conventional photolithographic and reactive ion etching, (RIE), processes. After photoresist removal, using oxygen plasma ashing, followed by wet cleans, the composite insulator pattern is used as an oxidation mask, and FOX region, 2, is created in non-masked areas, via thermal oxidation in an oxygen - steam ambient, to a thickness between about 4000 to 6000 Angstroms. After removal of the composite insulator pattern, using hot phosphoric acid for the silicon nitride layer, and a buffered hydrofluoric acid solution for the underlying silicon dioxide layer, a thin silicon dioxide, gate insulator, 3, is grown at a temperature between about 800° to 1000° C., to a thickness between about 50 to 300 Angstroms, in an oxygen - steam ambient. A polysilicon layer is next deposited using low pressure chemical vapor deposition, (LPCVD), processing, at a temperature between about 500° to 700° C., to a thickness between about 2000 to 4000 Angstroms. The polysilicon can be deposited intrinsically and doped via ion implantation of phosphorous or arsenic, at an energy between about 50 to 100 Kev., at a dose between about 1E15 to 1E16 atoms/cm$^2$. Another alternative is to deposit the polysilicon layer using insitu doping procedures via incorporation of either phosphine or arsine to a silane ambient. Conventional photolithographic and RIE processing, using $Cl_2$ as an etchant, are used to create polysilicon gate structure, 4, shown schematically in FIG. 1.

After photoresist removal, via oxygen plasma ashing and wet cleans, an N type, lightly doped source and drain region, 5, is created via ion implantation of phosphorous, at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), processes, at a temperature between about 400° to 800° C., using tetraethylorthosilicate as a source, to a thickness between about 1500 to 4000 Angstroms. An anisotropic, selective RIE process, using $CHF_3$ as an etchant, is used to create insulator sidewall spacer, 6, shown in FIG. 1. Another ion implantation procedure, fusing arsenic at an energy between about 50 to 100 Kev., at a dose between about 1E14 to 5E15 atoms/cm$^2$, is used to create the N+, heavily doped source and drain region, 7.

An insulator layer of silicon oxide, 8, is deposited using either LPCVD, PECVD, or atmospheric pressure chemical vapor deposition, (APCVD), processing, at a temperature between about 400° to 800° C., to a thickness between about 5000 to 10000 Angstroms. Contact hole, 9, is formed in silicon oxide layer, 8, via use of standard photolithographic and RIE procedures, using $CHF_3$ as an etchant. The trend to micro-miniaturazation demands contact holes with diameters in the sub-micron range, therefore the aspect ratio, the ratio of the depth of the contact hole divided by the diameter of the contact hole opening, using aggressive ground rules, can be large and therefore present difficulties when attempting to fill using conventional metal deposition procedures. FIG. 1, schematically shows this structure after photoresist removal, arrived at via oxygen plasma ashing and careful wet cleans.

FIGS. 2–4, will schematically describe prior art, and attempts at filling, and patterning, large aspect ratio, contact holes, using conventional tungsten deposition processes and standard RIE etch back procedures. FIG. 2, shows a large aspect ratio, contact hole, filled with tungsten, 10. The tungsten deposition was performed using LPCVD processing at a temperature between about 440° to 480° C., to a thickness between about 5000 to 8000 Angstroms, using tungsten hexafluoride as a source. The filling of high aspect ratio contact holes, such as contact hole, 9, results from tungsten depositing on the sidewalls of contact hole, 9. At the conclusion of the deposition, it is possible that a seam, 11a, in the tungsten fill can result due to a pinching, or closing effect, when the sidewall tungsten layers converge. The consequence of seam, 11a, in FIG. 2, is realized when a blanket, selective RIE process, is employed to remove unwanted tungsten, from the surface of silicon oxide layer, 8. This RIE procedure, using $SF_6$ as an etchant, aggravates seam, 11a, during the etch back procedure, and also during an overetch step, used to insure complete removal of unwanted tungsten. The thick tungsten layer, 10, initially used to fill the large aspect ratio contact hole, can result in large uniformity deltas, thus requiring longer etch back cycles, then would have been required if thinner, more uniform tungsten had been used. Seam, 11a, now exposed to long etch back cycles, can evolve into void 11b, shown schematically in FIG. 3. The large void, 11b, does not allow for adequate coverage of an overlying metallization layer, 12, shown in FIG. 4, with severe metal thinning in area, 13, which can result in yield loss due to metal opens, or result in reliability problems due to the increased current densities that will exist for metallization layer, 12, when overlying area, 13.

A process, designed to reduce or minimize the seam in a tungsten plug, which was prevalent in prior art due to exposure of the tungsten seam to subsequent dry etching procedures will now be described. Again applying this invention to the structure shown in FIG. 1, after a buffered hydrofluoric acid clean, of the exposed surface of the N type, heavily doped source and drain region, 7, a layer of titanium, 14, is deposited using r.f. sputtering, to a thickness between about 200 to 500 Angstroms. The titanium layer, 14, shown in FIG. 5, is used to improve the adhesion of subsequent metallizations to the underlying silicon oxide surfaces, 8, as well as providing an effective contact to the underlying, N type, heavily doped, source and drain region, 7. Next a layer of titanium nitride, 15, is deposited, again via use of r.f. sputtering, to a thickness between about 500 to 1000 Angstroms. Subsequent tungsten deposition procedures, using tungsten hexafluoride, can produce by-product reactants that can attack exposed underlying titanium and silicon. Therefore the titanium nitride layer, 15, behaves as a barrier, preventing the deleterious attack of underlying materials during the subsequent tungsten deposition. A deposition of tungsten, 17, is now performed using LPCVD processing, using tungsten hexafluoride and silane, at a temperature between about 440° to 480° C., to a thickness between about 5000 to 8000 Angstroms. Contact hole, 9, has been formed to a depth of between about 7000 to 10000 Angstroms, and with a opening, having a diameter between about 0.3 to 0.5 uM, resulting in aspect ratios between about 1 to 3. These high aspect ratios present problems when attempting to fill with LPCVD tungsten films. Again as previously shown in FIG. 2, a seam, 17, forms in the center of the tungsten fill, in the contact hole, due to the convergence of the tungsten coated sidewalls. This is shown schematically in FIG. 5.

Figure 6:
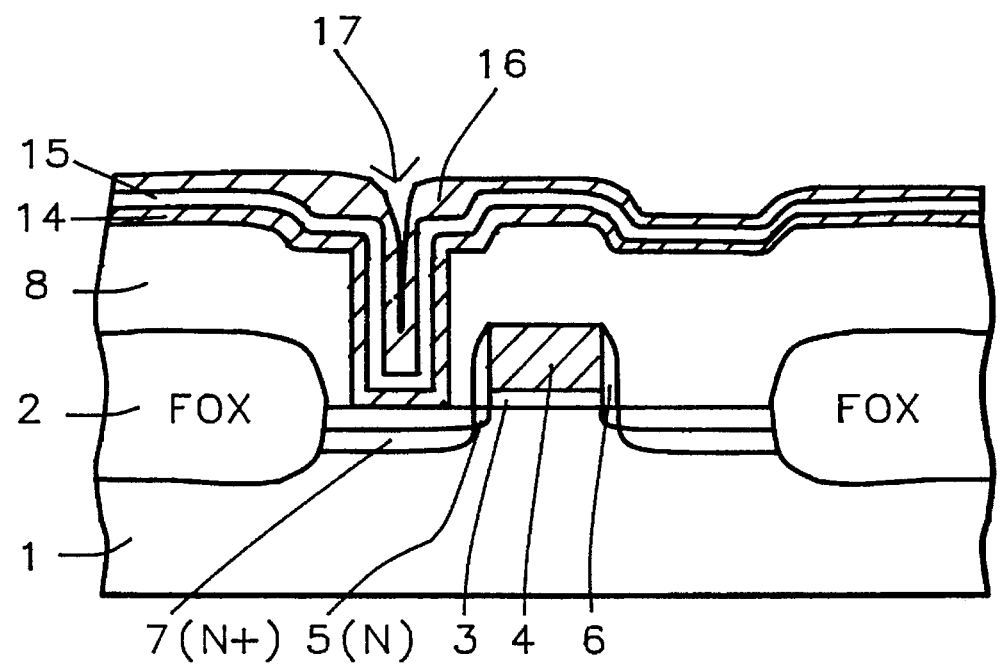

A blanket, selective RIE process is now used to remove most of tungsten layer, 16, from areas outside contact hole, 9. This procedure is accomplished using a RIE ambient of $SF_6$, and removes between about 4500 to 7500 Angstroms of tungsten, leaving between about 400 to 600 Angstroms of residual tungsten remaining outside the contact hole region. A tungsten plug in contact hole, 9, has now been formed, without seam 17, evolving into a larger seam or void, due to the limited exposure of seam, 17, to tungsten overetch procedures. This is schematically shown in FIG. 6.

Figure 7:
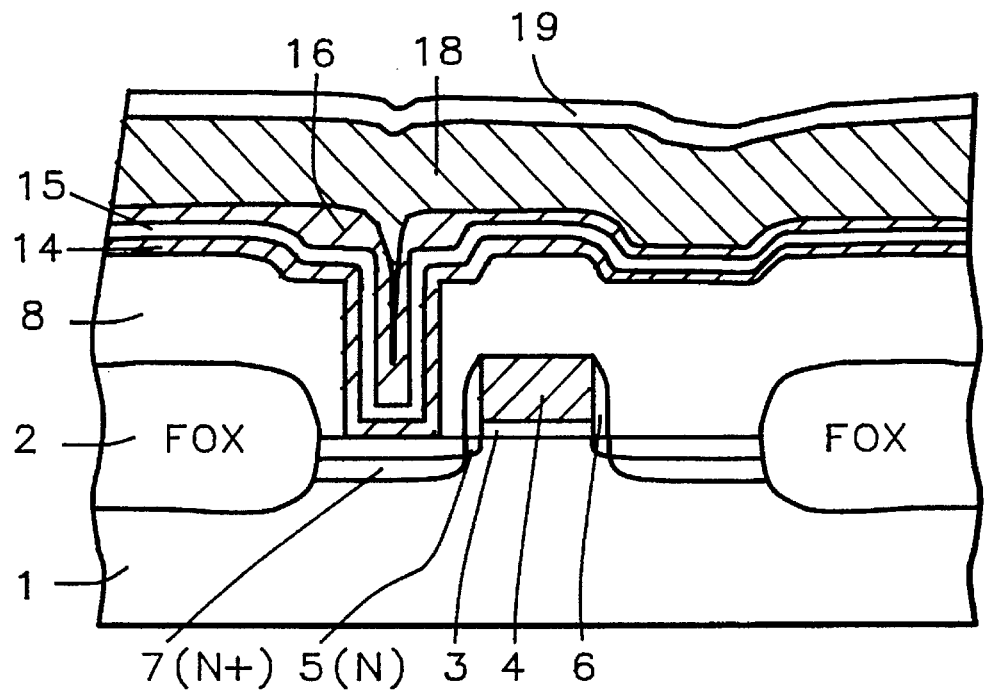
Figure 8:
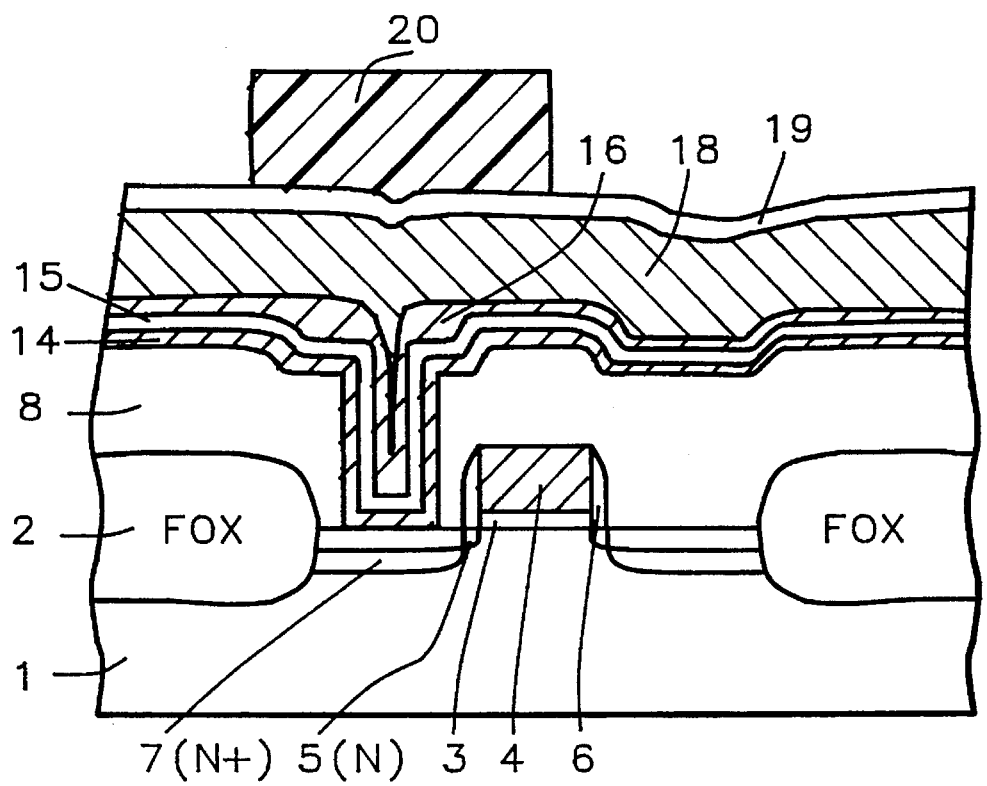
Figure 9:
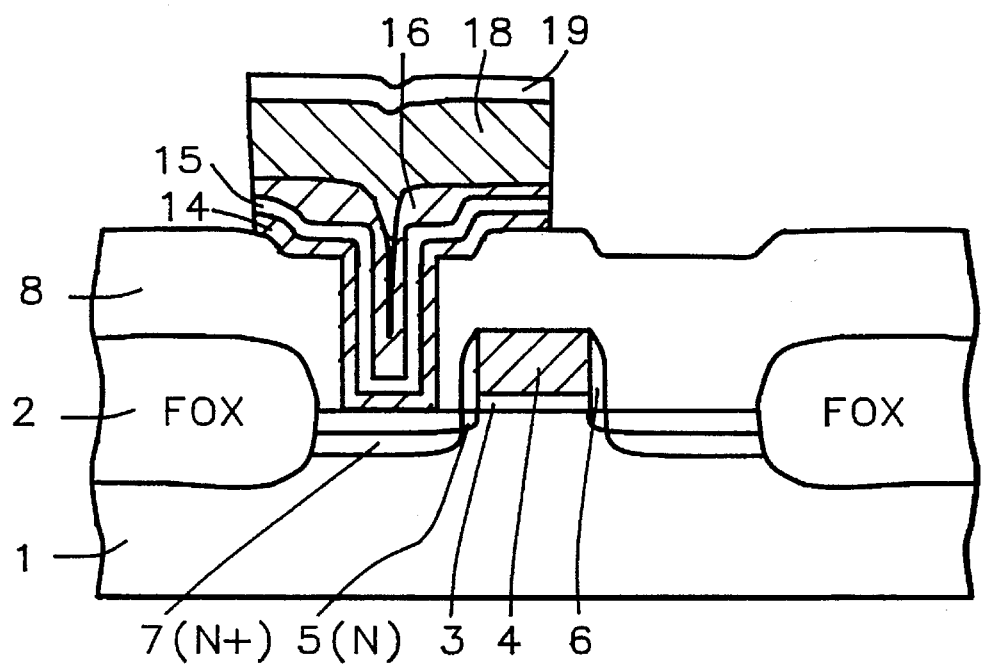

A layer of aluminum, 18, containing between about 0.8 to 1.2% copper, and between about 0.4 to 0.6% silicon, is next deposited, using r.f. sputtering, to a thickness between about 4000 to 6000 Angstroms, followed by another deposition of titanium nitride, 19, obtained via r.f. sputtering, to a thickness between about 1000 to 1400 Angstroms. These layers are shown in FIG. 7. The titanium nitride layer, 19, is used as an anti-reflective layer for subsequent photolithographic procedures, and also protects the underlying aluminum layer from possible contaminants and reaction from subsequent procedures. A photoresist pattern, 20, shown in FIG. 8, is used to define the desired shape of the subsequent interconnect metallization structure. First titanium nitride layer, 19, is etched via RIE procedures, using $Cl_2$ and $BCl_3$, followed by another RIE procedure, again using $Cl_2$ and $BCl_3$ as an etchant, to pattern the aluminum based layer, 18, using photoresist shape, 20, as a mask. At the completion of the etching of the aluminum based layer, and without breaking vacuum, the etch chemistry is changed to $SF_6$, and used to remove the residual tungsten, 16, with a thickness between about 400 to 600 Angstroms. The etching then continues to remove the unmasked titanium nitride layer, 15, as well as ,the titanium layer, 14, again via use of $Cl_2$ and $BCl_3$. Photoresist removal is then accomplished via plasma oxygen ashing, followed by careful wet cleans. The resulting structure of titanium nitride, 19, an aluminum based layer, 18, tungsten plug, 16, titanium nitride layer, 15, and titanium layer, 14, are shown schematically in FIG. 9. As a result of performing the extended tungsten removal cycle, at a stage in which the tungsten plug, in the contact hole, is protected with overlying materials, the mild seam, 17, did not evolve into a larger defect, perhaps eliminating possible yield or reliability degrading from occurring.

This process, although shown for tungsten filling small diameter contact holes, used to connect underlying active silicon device elements to overlying interconnect metallizations, can also be applied to tungsten filling of via holes, used to connect two levels of interconnect metallizations. In addition this process although shown as an application for an N channel, (NFET), device, can also be applied to P channel, (PFET), devices, complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a metal filled contact hole, to provide electrical contact between an underlying conductive region, in said semiconductor substrate, and an overlying interconnect metallization structure, comprising the steps of:

providing said underlying conductive region, in said semiconductor substrate;

depositing a dielectric layer on said semiconductor substrate, including depositing on said underlying conductive region;

photolithographic processing to open a small diameter hole, in a photoresist layer, exposing underlying said dielectric layer, directly over an area of said underlying conductive region;

anisotropic etching of said dielectric layer, in opening of said photoresist layer, to create a small diameter contact hole, to said underlying conductive region;

removal of said photoresist layer;

surface cleaning of said underlying conductive region, in said small diameter contact hole;

deposition of an adhesive layer on top surface of said dielectric layer, on sides of said small diameter contact hole, and on said underlying conductive region, in said small diameter contact hole;

deposition of a barrier layer on said adhesive layer;

deposition of a metal fill layer, on said barrier layer, completely filling said small diameter contact hole;

partial removal of said metal fill layer, from top surface of said barrier layer, forming a metal plug in said small diameter contact hole, while leaving metal fill residuals on top surface of said barrier layer;

deposition of a interconnect metallization layer, on said metal fill residuals on surface of said barrier layer, and on said metal plug, in said small diameter contact hole;

deposition of an anti-reflective layer, on said interconnect metallization layer;

photolithographic processing to create a photoresist shape on said anti-reflective layer, directly overlying said metal plug, in said small diameter contact hole;

anisotropic removal of said anti-reflective layer, of said interconnect metallization layer, of said metal fill residuals, of said barrier layer, and of said adhesive layer, in areas not covered by said photoresist shape, to create an interconnect metallization structure of said anti-reflective layer, said interconnect metallization layer, said metal fill residuals, said barrier layer, and said adhesive layer, overlying said metal plug, in said small diameter contact hole; and removal of said photoresist shape.

2. The method of claim 1, wherein said underlying conductive region, in said semiconductor substrate, is an N type, heavily doped source and drain region of a MOSFET device.

3. The method of claim 1, wherein said dielectric layer is silicon oxide, deposited using either LPCVD, PECVD, or APCVD processing, at a temperature between about 400° to 800° C., to a thickness between about 5000 to 10000 Angstroms.

4. The method of claim 1, wherein said small diameter contact hole is created using anisotropic, RIE processing, using $CHF_3$ as an etchant, with said small diameter contact hole having an opening with a diameter between about 0.3 to 0.5 uM, resulting in aspect ratios between about 1 to 3.

5. The method of claim 1, wherein said adhesive layer is titanium, deposited using r.f. sputtering, to a thickness between about 200 to 500 Angstroms.

6. The method of claim 1, wherein said barrier layer is titanium nitride, deposited using r.f. sputtering, to a thickness between about 500 to 1000 Angstroms.

7. The method of claim 1, wherein said metal fill layer is tungsten, deposited using LPCVD processing, at a temperature between about 440° to 480° C., to a thickness between about 5000 to 10000 Angstroms, using tungsten hexafluoride and silane.

8. The method of claim 1, wherein partial removal of said metal fill layer, from top surface of said barrier layer, is accomplished via RIE, using $SF_6$ as an etchant, leaving between about 400 to 600 Angstroms of said metal fill residuals remaining on top surface of said barrier layer.

9. The method of claim 1, wherein said interconnect metallization layer is aluminum, containing between about 0.8 to 1.2% copper, and between about 0.4 to 0.6% silicon, deposited using r.f. sputtering, to a thickness between about 4000 to 6000 Angstroms.

10. The method of claim 1, wherein said anti-reflective layer is titanium nitride, deposited using r.f. sputtering, to a thickness between about 1000 to 1400 Angstroms.

11. The method of claim 1, wherein said anti-reflective layer, and said interconnect metallization layer, are removed via anisotropic, RIE procedures, using $Cl_2$ and $BCl_3$ as an etchant.

12. The method of claim 1, wherein said metal fill residuals, are removed using anisotropic, RIE procedures, using $SF_6$ as an etchant, while said barrier and adhesive layers are removed using anisotropic RIE procedures, using $Cl_2$ and $BCl_3$ as etchants.

13. A method for fabricating a MOSFET device, on a semiconductor substrate, using a tungsten filled contact hole, to provide electrical contact between an underlying conductive region in said semiconductor substrate, and an overlying interconnect metallization structure, comprising the steps of:

providing said underlying conductive region, in said semiconductor substrate;

depositing a dielectric layer on said semiconductor substrate, including deposition on said underlying conductive region;

photolithographic processing to open a small diameter hole in a photoresist layer, exposing underlying said dielectric layer, directly over an area of said underlying conductive region;

anisotropic etching of said dielectric layer, in opening of said photoresist layer, to create a small diameter contact hole, to said underlying conductive region;

removal of said photoresist layer;

surface cleaning of said underlying conductive region, in said small diameter contact hole;

deposition of a titanium layer on the top surface of said dielectric layer, on the sides of said small diameter contact hole, and on said underlying conductive region, in said small diameter contact hole;

deposition of a first titanium nitride layer on said titanium layer;

deposition of a tungsten layer, on said first titanium nitride layer, completely filling said small diameter contact hole;

partial removal of said tungsten layer, from top surface of said first titanium nitride layer, forming a tungsten plug in said small diameter contact hole, while leaving tungsten residuals on top surface of said first titanium nitride layer;

deposition of an aluminum based metallization layer, on said tungsten residuals on surface of said first titanium nitride layer, and on said tungsten plug, in said small diameter contact hole;

deposition of a second titanium nitride layer on said aluminum based metallization layer;

photolithographic processing to create a photoresist shape, on said second titanium nitride layer, directly overlying said tungsten plug, in said small diameter contact hole;

anisotropic removal of said second titanium nitride layer, of said aluminum based metallization layer, of said tungsten residuals, of said first titanium nitride layer, and of said titanium layer, in areas not covered by said photoresist shape, to create an interconnect metallization structure of said second titanium nitride layer, of said aluminum based metallization layer, of said tungsten residuals, of said first titanium nitride layer, and of said titanium layer, overlying said tungsten plug, in said small diameter contact hole; and removal of said photoresist shape.

14. The method of claim 13, wherein said underlying conductive region, in said semiconductor substrate, ia an N type, heavily doped source and drain region of a MOSFET device.

15. The method of claim 13, wherein said dielectric layer is silicon oxide, deposited using either LPCVD, PECVD, or APCVD processing, at a temperature between about 400° to 800° C., to a thickness between about 5000 to 10000 Angstroms.

16. The method of claim 13, wherein said small diameter contact hole is created using anisotropic, RIE processing, using $CHF_3$ as an etchant, with said small diameter contact hole having an opening with a diameter between about 0.3 to 0.5 uM, resulting in aspect ratios between about 1 to 3.

17. The method of claim 13, wherein said titanium layer is deposited using r.f. sputtering, to a thickness between about 200 to 500 Angstroms.

18. The method of claim 13, wherein said first titanium nitride layer is deposited using r.f. sputtering, to a thickness between about 500 to 1000 Angstroms.

19. The method of claim 13, wherein said tungsten layer is deposited using LPCVD processing, at a temperature between about 440° to 480° C., to a thickness between about 5000 to 8000 Angstroms, using tungsten hexafluoride and silane.

20. The method of claim 13, wherein partial removal of said tungsten layer, from top surface of said first titanium nitride layer, is accomplished via RIE processing, using $SF_6$ as an etchant, leaving between about 400 to 600 Angstroms of said tungsten residuals remaining on surface of said first titanium nitride layer.

21. The method of claim 13, wherein said aluminum based metallization layer is aluminum, containing between about 0.8 to 1.2% copper, and between about 0.4 to 0.6% silicon, deposited using r.f. sputtering, to a thickness between about 4000 to 6000 Angstroms.

22. The method of claim 13, wherein said second titanium nitride layer is deposited using r.f. sputtering, to a thickness between about 1000 to 1400 Angstroms.

23. The method of claim 13, wherein said second titanium nitride layer, and said aluminum based metallization layer, are removed via anisotropic, RIE procedures, using $Cl_2$ and $BCl_3$ as etchants.

24. The method of claim 13, wherein said tungsten residuals, are removed via anisotropic, RIE procedures, using $SF_6$ as an etchant, while said first titanium nitride layer and said titanium layer are removed via anisotropic RIE procedures, using $Cl_2$ and $BCl_3$ as etchants.

* * * * *

UNITED STATES PATENT AND TRADEMARK OFFICE
CERTIFICATE OF CORRECTION

PATENT NO. : 5,622,894
DATED : April 22, 1997
INVENTOR(S) : Syun-Ming Jang
Chen-Hua Douglas Yu It is certified that error appears in the above-indentified patent and that said Letters Patent is hereby corrected as shown below: Title page:

Item(75), correct inventor's name from "Yu C. Douglas" to --Chen-Hua Douglas Yu--

Signed and Sealed this

Sixteenth Day of December, 1997

Attest:

BRUCE LEHMAN

Attesting Officer

Commissioner of Patents and Trademarks